(12) United States Patent
Khamankar et al.

(10) Patent No.: US 8,471,307 B2
(45) Date of Patent: Jun. 25, 2013

(54) IN-SITU CARBON DOPED E-SIGECB STACK FOR MOS TRANSISTOR

(75) Inventors: Rajesh B. Khamankar, Coppell, TX (US); Haowen Bu, Plano, TX (US); Douglas Tad Grider, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 174 days.

(21) Appl. No.: 12/482,896

(22) Filed: Jun. 11, 2009

(65) Prior Publication Data

US 2009/0309140 A1 Dec. 17, 2009

Related U.S. Application Data

(60) Provisional application No. 61/061,396, filed on Jun. 13, 2008.

(51) Int. Cl.
*H01L 29/76* (2006.01)

(52) U.S. Cl.
USPC ........... 257/288; 438/407; 438/520; 438/528; 438/548; 438/918; 257/607; 257/609; 257/610; 257/615; 257/616

(58) Field of Classification Search
USPC .................. 257/607, 609–616; 438/407, 520, 438/528, 548, 918, 143, 514, 543, 904, 917, 438/752, 933
See application file for complete search history.

(56) References Cited

U.S. PATENT DOCUMENTS

| | | | |
|---|---|---|---|
| 7,521,365 B2 * | 4/2009 | Kim et al. ...................... 438/694 |
| 7,544,997 B2 * | 6/2009 | Zhang et al. ................... 257/344 |
| 7,812,370 B2 * | 10/2010 | Bhuwalka et al. ............. 257/192 |
| 7,863,171 B2 * | 1/2011 | Hoentschel et al. ........... 438/528 |
| 7,898,028 B2 * | 3/2011 | Chang et al. ................... 257/338 |
| 7,927,989 B2 * | 4/2011 | Zhang et al. ................... 438/524 |
| 2004/0084754 A1 * | 5/2004 | Geiss et al. ...................... 257/565 |
| 2004/0106264 A1 * | 6/2004 | Loechelt ......................... 438/312 |
| 2006/0220127 A1 * | 10/2006 | Mantl ............................. 257/347 |
| 2007/0001164 A1 * | 1/2007 | Cha .................................. 257/19 |
| 2007/0010077 A1 * | 1/2007 | Riess et al. ...................... 438/548 |
| 2007/0252205 A1 * | 11/2007 | Hoentschel et al. ........... 257/347 |
| 2008/0251851 A1 * | 10/2008 | Pan et al. ........................ 257/369 |
| 2008/0296612 A1 * | 12/2008 | Schmidt et al. ................ 257/139 |
| 2009/0026582 A1 * | 1/2009 | Herner ............................ 257/616 |
| 2009/0278233 A1 * | 11/2009 | Pinnington et al. ............ 257/615 |
| 2010/0038727 A1 * | 2/2010 | Chakravarthi et al. ......... 257/408 |
| 2010/0140744 A1 * | 6/2010 | Bauer ............................. 257/607 |
| 2010/0200954 A1 * | 8/2010 | Del Agua Borniquel et al. ............................... 257/607 |
| 2011/0034014 A1 * | 2/2011 | Hatem et al. ................... 438/530 |

* cited by examiner

*Primary Examiner* — Allan R Wilson
*Assistant Examiner* — Mohammed Shamsuzzaman
(74) *Attorney, Agent, or Firm* — Jacqueline J. Garner; Wade J. Brady, III; Frederick J. Telecky, Jr.

(57) ABSTRACT

An integrated circuit containing a PMOS transistor with p-channel source/drain (PSD) regions which include a three layer PSD stack containing Si—Ge, carbon and boron. The first PSD layer is Si—Ge and includes carbon at a density between $5 \times 10^{19}$ and $2 \times 10^{20}$ atoms/cm$^3$. The second PSD layer is Si—Ge and includes carbon at a density between $5 \times 10^{19}$ atoms/cm$^3$ and $2 \times 10^{20}$ atoms/cm$^3$ and boron at a density above $5 \times 10^{19}$ atoms/cm$^3$. The third PSD layer is silicon or Si—Ge, includes boron at a density above $5 \times 10^{19}$ atoms/cm$^3$ and is substantially free of carbon. After formation of the three layer epitaxial stack, the first PSD layer has a boron density less than 10 percent of the boron density in the second PSD layer. A process for forming an integrated circuit containing a PMOS transistor with a three layer PSD stack in PSD recesses.

7 Claims, 5 Drawing Sheets

IN-SITU CARBON DOPED E-SIGECB STACK FOR MOS TRANSISTOR

CROSS-REFERENCE TO RELATED APPLICATIONS

This patent application claims priority from U.S. Provisional Patent Application No. 61/061,396, filed Jun. 13, 2008, the entirety of which is hereby incorporated herein by reference. The following co-pending patent application is related and hereby incorporated by reference: U.S. patent application Ser. No. 11/693,552 (filed Mar. 29, 2007).

FIELD OF THE INVENTION

This invention relates to the field of integrated circuits. More particularly, this invention relates to MOS transistors in integrated circuits.

BACKGROUND OF THE INVENTION

Integrated circuits, such as complementary metal oxide semiconductor (CMOS) integrated circuits may contain p-channel metal oxide semiconductor (PMOS) transistors, n-channel metal oxide semiconductor (NMOS) transistors and possibly other components. Silicon germanium (Si—Ge) may be grown in source/drain regions of PMOS transistors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a PMOS transistor may have p-channel source/drain (PSD) regions which include a three layer PSD stack containing Si—Ge, carbon and boron. The first PSD layer is Si—Ge and includes carbon at a density between $5 \times 10^{19}$ and $2 \times 10^{20}$ atoms/cm$^3$. The second PSD layer is Si—Ge and includes carbon at a density between $5 \times 10^{19}$ atoms/cm$^3$ and $2 \times 10^{20}$ atoms/cm$^3$ and boron at a density above $5 \times 10^{19}$ atoms/cm$^3$. The third PSD layer is silicon or Si—Ge, includes boron at a density above $5 \times 10^{19}$ atoms/cm$^3$ and is substantially free of carbon. After formation of the three layer epitaxial stack, the first PSD layer has a boron density less than 10 percent of the boron density in the second PSD layer. A process for forming an integrated circuit containing a PMOS transistor with a three layer PSD stack in PSD recesses having the properties recited above is also disclosed.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A p-channel metal oxide semiconductor (PMOS) transistor in an integrated circuit may have p-channel source/drain (PSD) regions which include a three layer PSD stack containing Si—Ge, carbon and boron. A first PSD layer of Si—Ge includes carbon at a density between $5 \times 10^{19}$ and $2 \times 10^{20}$ atoms/cm$^3$. A second PSD layer of Si—Ge includes substitutional carbon at a density between $5 \times 10^{19}$ atoms/cm$^3$ and $2 \times 10^{20}$ atoms/cm$^3$ and boron at a density above $5 \times 10^{19}$ atoms/cm$^3$. A third PSD layer of silicon or Si—Ge includes boron at a density above $5 \times 10^{19}$ atoms/cm$^3$. A germanium content of the first PSD layer is between 20 atomic percent and 35 atomic percent. A germanium content of the second PSD layer is between 20 atomic percent and 35 atomic percent. A germanium content of the third PSD layer is between zero and 35 atomic percent. After formation of the three layer epitaxial stack, the first PSD layer has a boron density less than 10 percent of the boron density in the second PSD layer. No carbon is intentionally introduced into the third PSD layer during its formation.

Figure 1A:
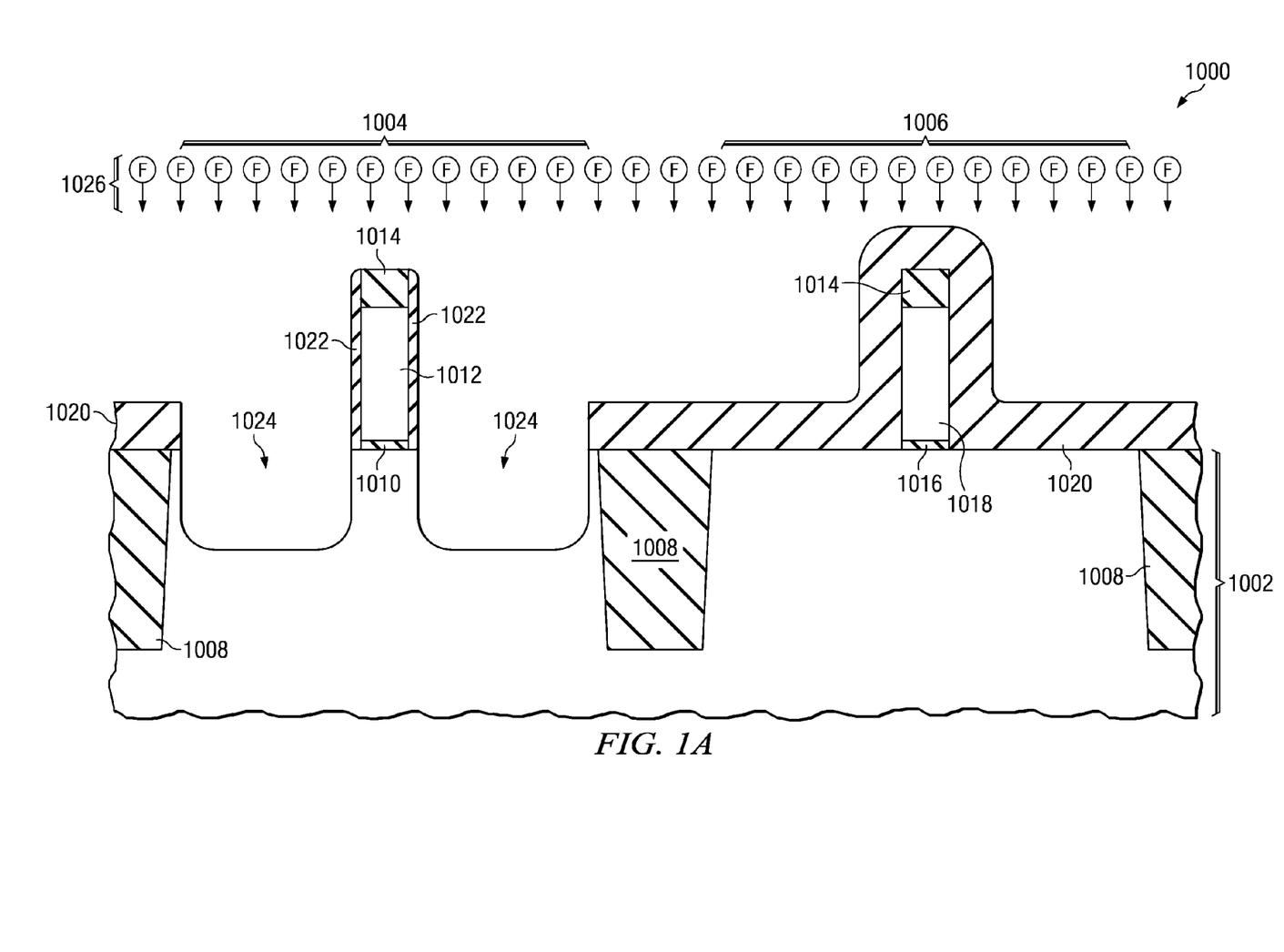
FIG. 1A through FIG. 1E are cross-sections of an integrated circuit containing a PMOS transistor with source/drain regions including a three layer PSD stack formed according to an embodiment, depicted in successive stages of fabrication.

FIG. 1A through FIG. 1E are cross-sections of an integrated circuit, possibly a complementary metal oxide semiconductor (CMOS) integrated circuit, containing a PMOS transistor with source/drain regions including a three layer PSD stack formed according to an embodiment, depicted in successive stages of fabrication. Referring to FIG. 1A, the integrated circuit (1000) is formed in and on a substrate (1002) which may be a single crystal silicon wafer, or a silicon-on-insulator (SOI) wafer, a hybrid orientation technology (HOT) wafer with regions of different crystal orientations, or other material appropriate for fabrication of the integrated circuit (1000). The integrated circuit includes an area defined for a PMOS transistor (1004) and possibly an area defined for an n-channel metal oxide semiconductor (NMOS) transistor (1006). Elements of field oxide (1008) are formed at a top surface of the substrate (1002), typically of silicon dioxide between 250 and 600 nanometers thick, commonly by shallow trench isolation (STI) processes. In STI processes, silicon dioxide may be deposited by high density plasma (HDP) or high aspect ratio process (HARP). The field oxide (1008) elements may separate the PMOS area (1004) from the NMOS area (1006), and may separate the PMOS area (1004) and the NMOS area (1006) from other components (not shown) in the integrated circuit (1000). Ion implanted regions such as wells and threshold adjustment regions are not shown in FIG. 1A through FIG. 1E for clarity.

The PMOS area (1004) includes a PMOS gate dielectric layer (1010) formed on a top surface of the substrate (1002). The PMOS gate dielectric layer (1010) may be one or more layers of silicon dioxide (SiO$_2$), silicon oxy-nitride (SiON), aluminum oxide (Al$_2$O$_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The PMOS gate dielectric layer (1010) may include nitrogen as a result of exposure to a nitrogen containing plasma or a nitrogen containing ambient gas at temperatures between 50 C and 800 C. The PMOS gate dielectric layer (1010) may be between 1 and 4 nanometers thick. The PMOS gate dielectric layer (1010) may be formed by any of a variety of gate dielectric formation processes, for example thermal oxidation, plasma nitridation of an oxide layer, and/or dielectric material deposition by atomic layer deposition (ALD).

The PMOS area (1004) includes a PMOS gate (1012), formed on a top surface of the PMOS gate dielectric layer (1010). The PMOS gate (1012) may be polycrystalline silicon, commonly known as polysilicon. The PMOS gate (1012) may be formed for example by forming a layer of gate material on the top surface of the PMOS gate dielectric layer (1010), forming a PMOS gate photoresist pattern (not shown) over the gate material to define an area for the PMOS gate (1012), and removing unwanted gate material by etch processes such as reactive ion etching (RIE). An etch stop layer (1014) may be formed on a top surface of the PMOS gate (1012). In one realization of the instant embodiment, the etch stop layer (1014) may be silicon nitride. In another realization, the etch stop layer (1014) may be silicon dioxide. The etch stop layer (1014) may be formed, for example, by forming a layer of etch stop material on a top surface of the layer of gate material, and removing unwanted etch stop material prior to removal of unwanted gate material during formation of the PMOS gate (1012).

The NMOS area (1006) includes an NMOS gate dielectric layer (1016) formed on the top surface of the substrate (1002). The NMOS gate dielectric layer (1016) may be formed of the same or similar materials as the PMOS gate dielectric layer (1010) with similar physical dimensions and characteristics. In one realization of the instant embodiment, the NMOS gate dielectric layer (1016) may be formed concurrently with the PMOS gate dielectric layer (1010).

The NMOS area (1006) includes an NMOS gate (1018) formed on a top surface of the NMOS gate dielectric layer (1016). The NMOS gate (1018) may be formed of the same or similar materials as the PMOS gate (1012). In one realization of the instant embodiment, the NMOS gate (1018) may be formed concurrently with the PMOS gate (1012). The etch stop layer (1014) may be formed on a top surface of the NMOS gate (1018) concurrently with its formation on the PMOS gate (1012).

A PSD etch blocking layer (1020) may be formed over the NMOS area (1006) to prevent removal of substrate (1002) material during a subsequent PSD recess formation process. In one realization of the instant embodiment, the PSD etch blocking layer (1020) may be silicon nitride. Material from the PSD etch blocking layer (1020) may form PSD etch spacers (1022) on lateral surfaces of the PMOS gate (1012), for example by depositing the PSD etch blocking layer (1020) in a conformal configuration and removing material from the PSD etch blocking layer (1020) in the PMOS area (1004) with an anisotropic etch process such as an RIE process.

PSD recesses (1024) are formed in the substrate (1002) in the PMOS area (1004) adjacent to the PMOS gate (1012) by a PSD recess formation process (1026). In one realization of the instant embodiment, the PSD recess formation process (1026) may include a fluorine containing RIE process, as depicted in FIG. 1A. Other processes for forming the PSD recesses (1024) are within the scope of the instant embodiment. The PSD recesses (1024) may be between 50 and 120 nanometers deep. In one realization, the PSD recesses (1024) may be between 70 and 100 nanometers deep.

After formation of the PSD recesses (1024) is complete, exposed surfaces of the substrate (1002) in the PSD recesses (1024) may be cleaned with a hydrofluoric acid solution and baked prior to subsequent formation of an epitaxial layer. In one realization of the instant embodiment, the integrated circuit (1000) may be baked at a temperature between 800 C and 900 C, while exposing an existing top surface of the integrated circuit (1000) to a hydrogen containing ambient for a time between 15 seconds and 60 seconds. In a further realization, the integrated circuit (1000) may be baked at a temperature between 840 C and 860 C for a time between 25 seconds and 35 seconds, while providing a hydrogen containing ambient by flowing at least 5 standard liters per minute (slm) of hydrogen gas over the existing top surface of the integrated circuit (1000).

Figure 1B:
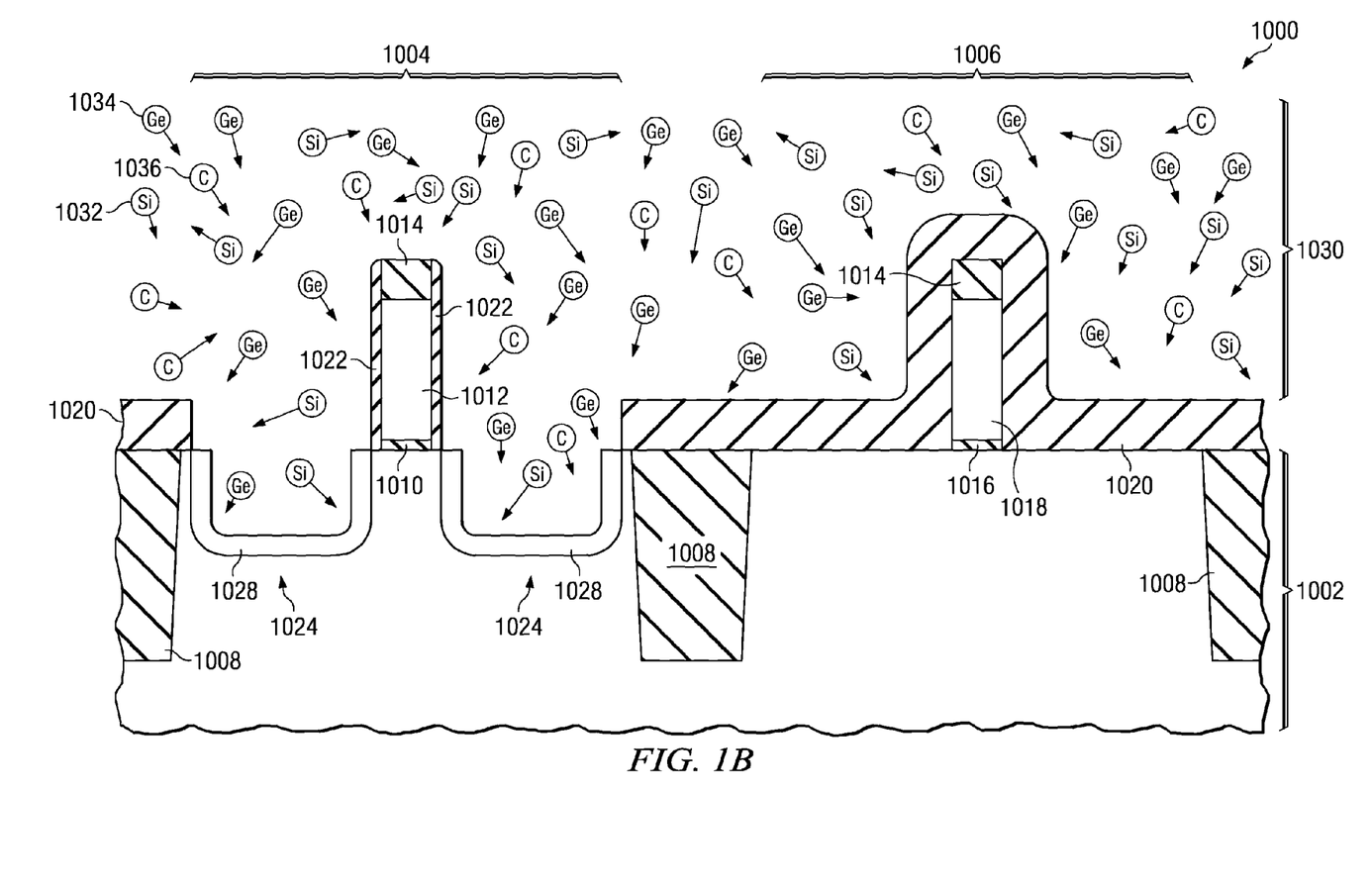

FIG. 1B depicts the integrated circuit (1000) during formation of a first PSD layer (1028) on exposed surfaces of the substrate (1002) in the PSD recesses (1024). In one realization of the instant embodiment, the first PSD layer (1028) may be formed by a first epitaxial growth process. For example the integrated circuit (1000) may be heated to a temperature between 600 C and 700 C, while exposing the existing top surface of the integrated circuit (1000) to a first epitaxial growth ambient (1030) containing silicon (1032), germanium (1034) and carbon (1036) as depicted in FIG. 1B. The first epitaxial growth ambient (1030) may be formed, for example, by flowing at least 5 slm of hydrogen gas, flowing between 50 standard cubic centimeters per minute (sccm) and 150 sccm of dichlorosilane gas, flowing between 30 sccm and 200 sccm of a gas mixture of between 5 and 10 percent germane gas and a carrier gas such as hydrogen, flowing between 50 sccm and 200 sccm of a gas mixture of between 0.25 percent and 2 percent of methylsilane and a carrier gas such as hydrogen, and flowing between 50 sccm and 100 sccm hydrogen chloride gas, into the first epitaxial growth ambient (1030) at a pressure between 5 torr and 20 torr. Substantially no boron is introduced into the first PSD layer (1028) during its formation. In one realization of the instant embodiment, the integrated circuit (1000) may be heated to a temperature between 640 C and 660 C during formation of the first PSD layer (1028).

The first PSD layer (1028) may be between 10 nanometers and 30 nanometers thick on lateral surfaces of the PSD recesses (1024). In one realization of the instant embodiment, a germanium content of the first PSD layer (1028) may be between 20 atomic percent and 30 atomic percent. A carbon density of the first PSD layer (1028) is between $5 \times 10^{19}$ and $2 \times 10^{20}$ atoms/cm$^3$.

Figure 1C:
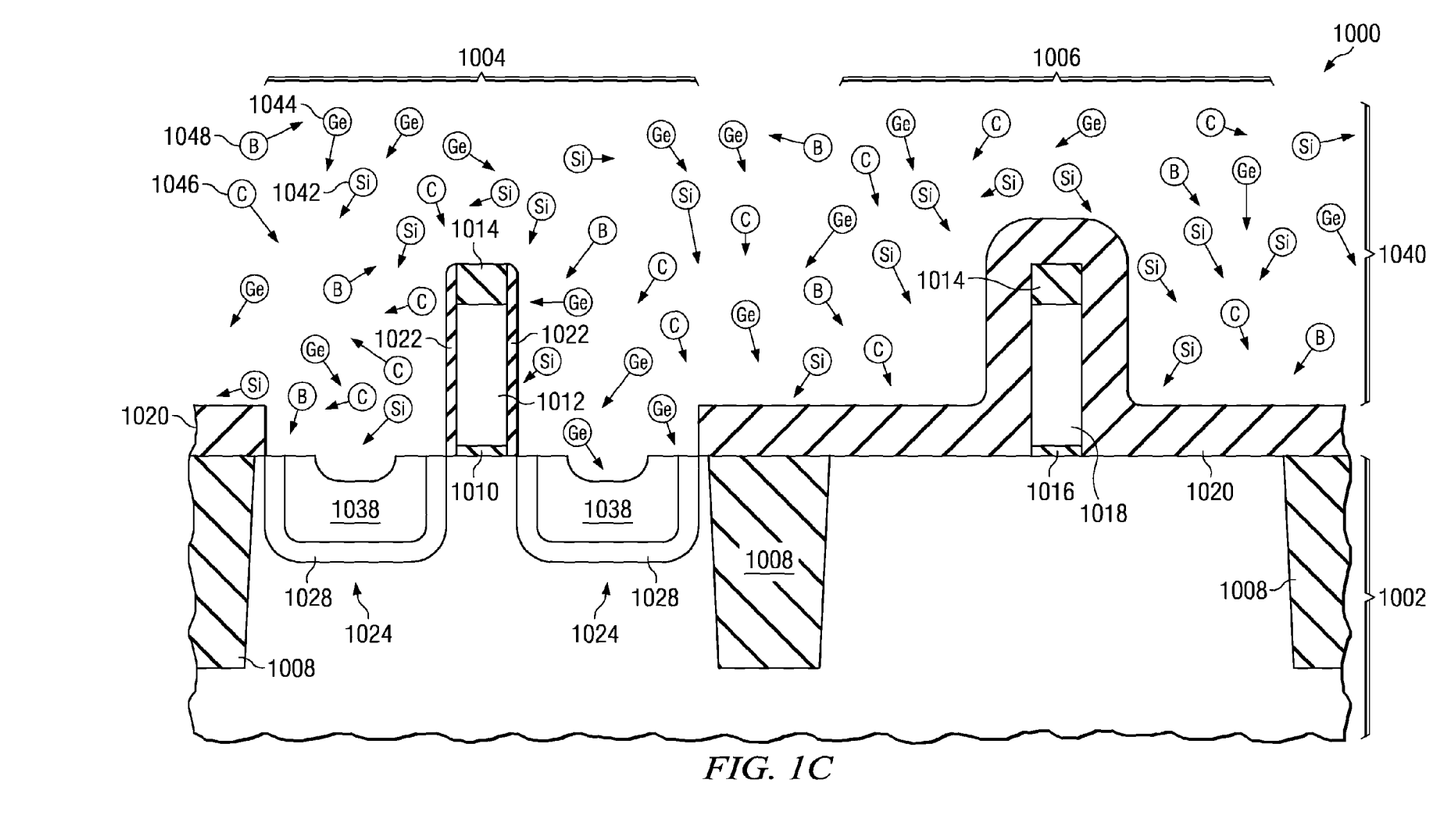

FIG. 1C depicts the integrated circuit (1000) during formation of a second PSD layer (1038) on exposed surfaces of the first PSD layer (1028) in the PSD recesses (1024). In one realization of the instant embodiment, the second PSD layer (1038) may be formed by a second epitaxial growth process. For example the integrated circuit (1000) may be heated to a temperature between 600 C and 700 C, while exposing an existing top surface of the integrated circuit (1000) to a second epitaxial growth ambient (1040) containing silicon (1042), germanium (1044), carbon (1046) and boron (1048) as depicted in FIG. 1C. The second epitaxial growth ambient (1040) may be formed, for example, by flowing at least 5 slm of hydrogen gas, flowing between 50 standard cubic centimeters per minute (sccm) and 150 sccm of dichlorosilane gas, flowing between 30 sccm and 200 sccm of a gas mixture of between 5 and 10 percent germane gas and a carrier gas such as hydrogen, flowing between 50 sccm and 200 sccm of a gas mixture of between 0.25 percent and 2 percent of methylsilane and a carrier gas such as hydrogen, flowing between 50 sccm and 100 sccm hydrogen chloride gas, and flowing between 50 sccm and 200 sccm of a gas mixture of between 0.5 percent and 1 percent of diborane and a carrier gas such as hydrogen, into the second epitaxial growth ambient (1040) at a pressure between 5 torr and 20 torr. In one realization of the instant embodiment, the integrated circuit (1000) may be heated to a temperature between 640 C and 660 C during formation of the second PSD layer (1038).

A thickness of the second PSD layer (1038) may be such that a top surface of the second PSD layer (1038) is within 10 nanometers of the top surface of the substrate (1002) adjacent to the PSD recesses (1024). In one realization of the instant embodiment, a germanium content of the second PSD layer (1038) may be between 20 atomic percent and 30 atomic percent. A carbon density of the second PSD layer (1038) is between $5 \times 10^{19}$ and $1 \times 10^{20}$ atoms/cm$^3$. A boron density of the second PSD layer (1038) is at least $5 \times 10^{19}$ atoms/cm$^3$.

Figure 1D:
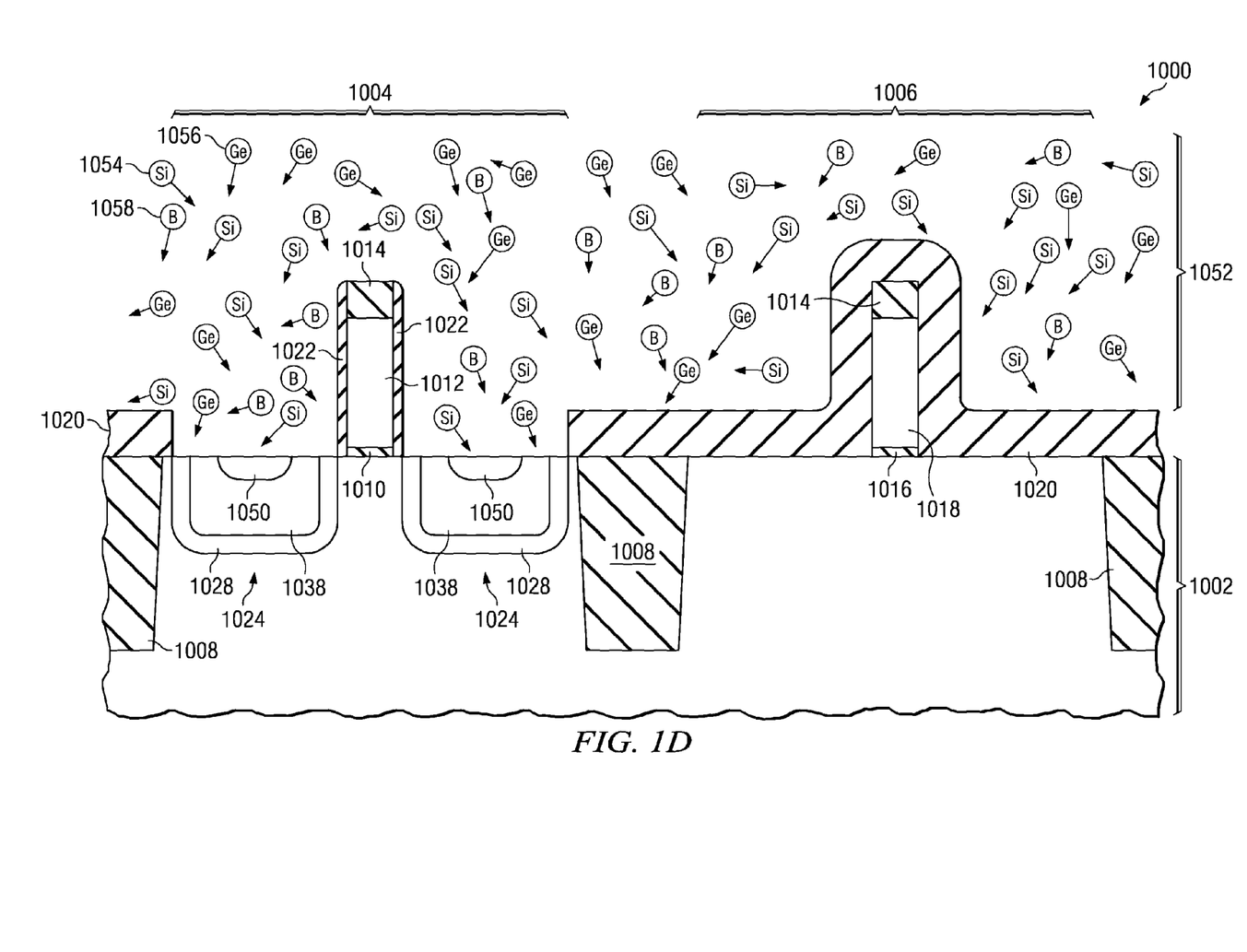

FIG. 1D depicts the integrated circuit (1000) during formation of a third PSD layer (1050) on exposed surfaces of the second PSD layer (1038) in the PSD recesses (1024). In one realization of the instant embodiment, the third PSD layer (1050) may be formed by a third epitaxial growth process. For example the integrated circuit (1000) may be heated to a temperature between 600 C and 700 C, while exposing an existing top surface of the integrated circuit (1000) to a third epitaxial growth ambient (1052) containing silicon (1054), germanium (1056) and boron (1058) as depicted in FIG. 1D. The third epitaxial growth ambient (1052) may be formed, for example, by flowing at least 5 slm of hydrogen gas, between 50 standard cubic centimeters per minute (sccm) and 150 sccm of dichlorosilane gas, flowing up to 200 sccm of a gas mixture of between 5 and 10 percent germane gas and a carrier gas such as hydrogen, flowing between 50 sccm and 100 sccm hydrogen chloride gas, and flowing between 50 sccm and 200 sccm of a gas mixture of between 0.5 percent and 1 percent of diborane and a carrier gas such as hydrogen, into the third epitaxial growth ambient (1052) at a pressure between 5 torr and 20 torr. In a further realization of the instant embodiment, the integrated circuit (1000) may be heated to a temperature between 640 C and 660 C during formation of the third PSD layer (1050).

In a realization of the instant embodiment in which substantially no germanium is intentionally introduced into the third PSD layer (1050) during its formation, the integrated circuit (1000) may be heated to a temperature between 700 C and 800 C, while the third epitaxial growth ambient (1052) may be formed, for example, by flowing at least 5 slm of hydrogen gas, between 50 standard cubic centimeters per minute (sccm) and 150 sccm of dichlorosilane gas, and between 10 sccm and 100 sccm hydrogen chloride gas, into the third epitaxial growth ambient (1052) at a pressure between 5 torr and 20 torr. In a further realization of the instant embodiment, the integrated circuit (1000) may be heated to a temperature between 730 C and 750 C during formation of the third PSD layer (1050).

A thickness of the third PSD layer (1050) may be between 15 nanometers and 40 nanometers. In one realization of the instant embodiment, the germanium content of the third PSD layer (1050) may be between 20 atomic percent and 30 atomic percent. A boron density of the third PSD layer (1050) is at least $5 \times 10^{19}$ atoms/cm$^3$. Substantially no carbon is introduced into the third PSD layer (1050) during its formation, so that a carbon density of the third PSD layer is less than $5 \times 10^{18}$ atoms/cm$^3$. After formation of the third PSD layer (1050) is complete, a boron density of the first PSD layer (1028) is less than 10 percent of the boron density of the second PSD layer (1038).

Figure 1E:
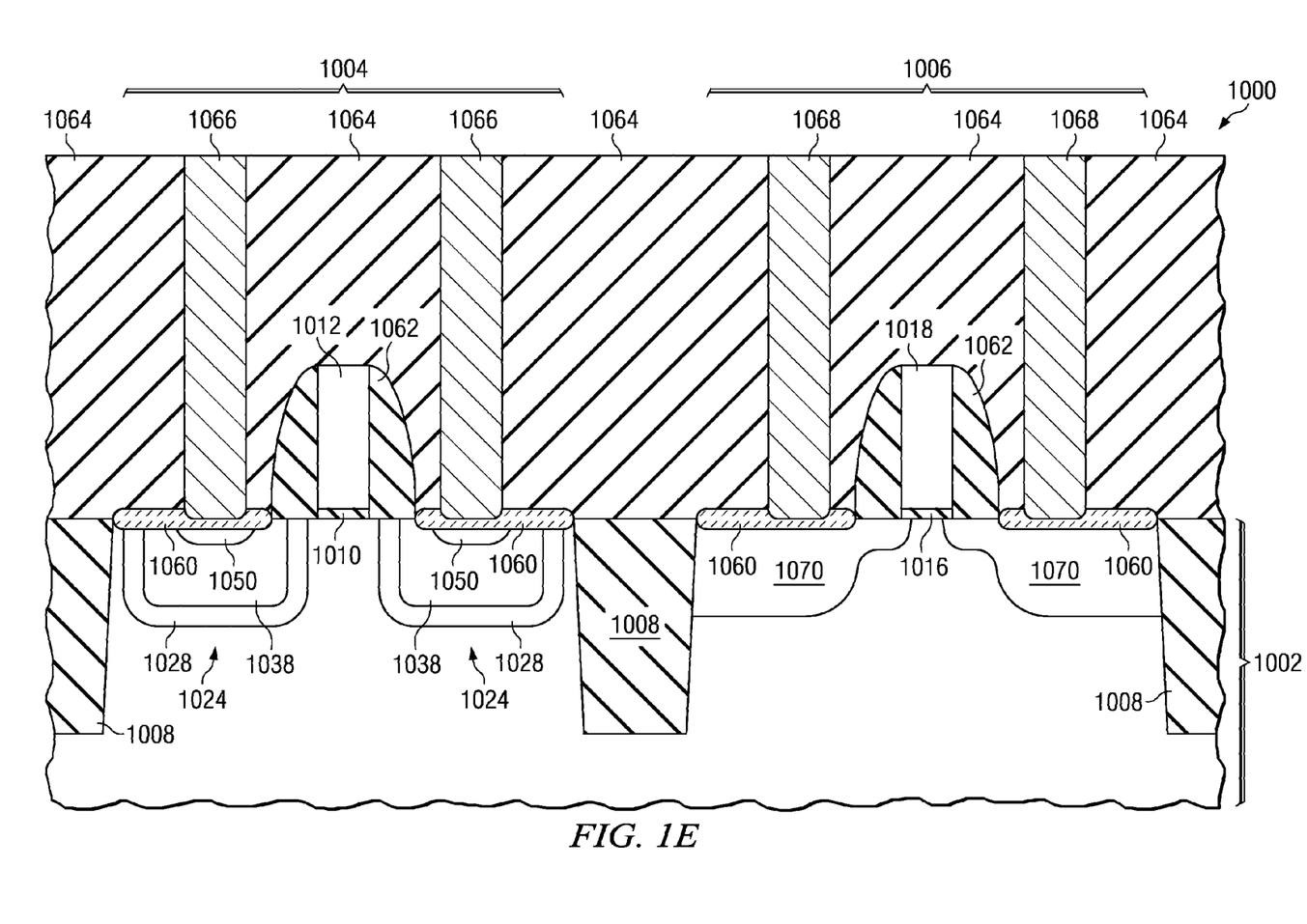

FIG. 1E depicts the integrated circuit (1000) at a further stage of fabrication. Metal silicide (1060), for example nickel silicide, is formed on exposed top surfaces of source and drain regions in the area defined for the PMOS transistor (1004) and the area defined for the NMOS transistor (1006). In one realization of the instant embodiment, the metal silicide (1060) does extend below a bottom surface of the third PSD layer (1050). The metal silicide may formed by a process including steps of depositing a layer of metal, for example nickel, cobalt, or titanium, on an existing top surface of the integrated circuit (1000), heating the integrated circuit (1000) to react a portion of the metal with exposed silicon and Si—Ge in exposed areas of source and drain regions in the area defined for the PMOS transistor (1004) and the area defined for the NMOS transistor (1006), and selectively removing unreacted metal from the integrated circuit (1000) surface, commonly by exposing the integrated circuit (1000) to wet etchants such as a mixture of an acid and hydrogen peroxide.

Gate sidewall spacers (1062) may be formed on lateral surfaces of the PMOS gate (1012) and the NMOS gate (1018). The gate sidewall spacers (1062) may be formed by a process including steps of deposition of one or more conformal layers of silicon nitride and/or silicon dioxide on an existing top surface of the integrated circuit (1000), followed by removal of the conformal layer material from the top surfaces of the PMOS gate (1012) and the NMOS gate (1018) by anisotropic etching methods, leaving the conformal layer material on the lateral surfaces of the PMOS gate (1012) and the NMOS gate (1018).

A pre-metal dielectric (PMD) layer (1064) is formed on an existing top surface of the integrated circuit (1000). The PMD layer (1064) may be a dielectric layer stack including a PMD liner, a PMD main layer, and an optional PMD cap layer. The PMD liner is commonly silicon nitride or silicon dioxide, 10 to 100 nanometers thick, deposited by plasma enhanced chemical vapor deposition (PECVD) top surface of the integrated circuit (1000). The PMD main layer is commonly a layer of silicon dioxide, phospho-silicate glass (PSG) or boro-phospho-silicate glass (BPSG), commonly 100 to 1000 nanometers thick, deposited by PECVD on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

PMOS contacts (1066) are formed in the PMD layer (1064) so as to make electrical contact with the metal silicide (1060) in the area defined for the PMOS transistor (1004). In one realization of the instant embodiment, bottom surfaces of the PMOS contacts (1066) do not touch the second PSD layer (1038). NMOS contacts (1068) are formed in the PMD layer (1064) so as to make electrical contact with metal silicide (1060) in the area defined for the NMOS transistor (1006). The PMOS contacts (1066) and NMOS contacts (1068) may be formed concurrently, for example by defining contact areas on a top surface of the PMD layer (1064) with a contact photoresist pattern, not shown in FIG. 1E for clarity, etching contact holes in the contact areas by removing PMD layer material using RIE etching methods, and filling the contact holes with a contact liner metal, such as titanium, and a contact fill metal, typically tungsten, followed by removal of the contact fill metal from the top surface of the PMD layer (1064) using etching and/or CMP methods.

Forming the first PSD layer (1028) to have a boron density less than 10 percent of the boron density of the second PSD layer (1038) may reduce boron penetration into a channel region in the substrate under the PMOS gate dielectric layer (1010), and so may advantageously provide a lower off-state leakage current density compared to PMOS transistors with substantially equal gate lengths and on-state current densities which include Si—Ge epitaxial layers abutting substrates containing more boron. Forming the third PSD layer (1050) by introducing substantially no carbon may form a lower resistance electrical connection between the third PSD layer (1050) and the metal silicide (1060), and so may advantageously provide a lower series resistance of the PMOS transistor compared to PMOS transistors with carbon in Si—Ge PSD layers abutting contacts.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit containing a p-channel metal oxide semiconductor (PMOS) transistor, comprising the steps:
   providing a substrate;
   forming a PMOS gate dielectric layer on a top surface of said substrate; forming a PMOS gate on a top surface of said PMOS gate dielectric layer; forming p-channel source/drain (PSD) recesses in said substrate adjacent to said PMOS gate by a process of removing substrate material;
   forming a three layer PSD stack in said PSD recesses, by a process further including the steps;
   forming a first PSD layer of Si—Ge on exposed surfaces of said substrate in said PSD recesses using a process that includes no boron source, such that:
      a thickness of said first PSD layer on sidewalls of said PSD recesses is at least 10 nanometers;
      a germanium content of said first PSD layer is between 20 atomic percent and 35 atomic percent; and
      a carbon density of said first PSD layer is between $5 \times 10^{19}$ and $2 \times 10^{20}$ atoms/cm$^3$;
   forming a second PSD layer on exposed surfaces of said first PSD layer, such that:
      a germanium content of said second PSD layer is between 20 atomic percent and 35 atomic percent;
      a carbon density of said second PSD layer is between $5 \times 10^{19}$ and $1 \times 10^{20}$ atoms/cm$^3$; and
      a boron density of said second PSD layer is at least $5 \times 10^{19}$ atoms/cm$^3$;
      a boron density of said first PSD layer after forming the second PSD layer is between 0 and 10 percent of said boron density of said second PSD layer; and
   forming a third PSD layer on exposed surfaces of said second PSD layer, such that:
      said third PSD layer includes silicon;
      a germanium content of said third PSD layer is between zero and 35 atomic percent;
      a carbon density of said third PSD layer is less than $5 \times 10^{18}$ atoms/cm$^3$; and
      a boron density of said third PSD layer is at least $5 \times 10^{19}$ atoms/cm$^3$;
   forming metal silicide on a top surface of said third PSD layer; and forming PMOS contacts on said metal silicide.

2. The process of claim 1, in which said process of forming said first PSD layer further includes the steps:
   heating said integrated circuit to a temperature between 600 C and 700 C;
   exposing an existing top surface of said integrated circuit to a first epitaxial growth ambient containing silicon, germanium and carbon at a pressure between 5 torr and 20 torr by a process further including the steps:
      flowing at least 5 slm of hydrogen gas into said first epitaxial growth ambient;
      flowing between 50 sccm and 150 sccm of dichlorosilane gas into said first epitaxial growth ambient;
      flowing between 30 sccm and 200 sccm of a gas mixture of between 5 and 10 percent germane gas and a carrier gas into said first epitaxial growth ambient;
      flowing between 50 sccm and 200 sccm of a gas mixture of between 0.25 percent and 2 percent of methylsilane and a carrier gas into said first epitaxial growth ambient; and
      flowing between 50 sccm and 100 sccm hydrogen chloride gas into said first epitaxial growth ambient.

3. The process of claim 1, in which said process of forming said second PSD layer further includes the steps:
   heating said integrated circuit to a temperature between 600 C and 700 C;
   exposing an existing top surface of said integrated circuit to a second epitaxial growth ambient containing silicon, germanium, carbon and boron at a pressure between 5 torr and 20 torr by a process further including the steps:
      flowing at least 5 slm of hydrogen gas into said second epitaxial growth ambient;
      flowing between 50 sccm and 150 sccm of dichlorosilane gas into said second epitaxial growth ambient;
      flowing between 30 sccm and 200 sccm of a gas mixture of between 5 and 10 percent germane gas and a carrier gas into said second epitaxial growth ambient;
      flowing between 50 sccm and 200 sccm of a gas mixture of between 0.25 percent and 2 percent of methylsilane and a carrier gas into said second epitaxial growth ambient;
      flowing between 50 sccm and 100 sccm hydrogen chloride gas into said second epitaxial growth ambient; and
      flowing between 50 sccm and 200 sccm of a gas mixture of between 0.5 percent and 1 percent of diborane and a carrier gas into said second epitaxial growth ambient.

4. The process of claim 1, in which said process of forming said third PSD layer further includes the steps:
   heating said integrated circuit to a temperature between 600 C and 700 C;
   exposing an existing top surface of said integrated circuit to a third epitaxial growth ambient containing silicon, germanium and boron at a pressure between 5 torr and 20 torr by a process further including the steps:
      flowing at least 5 slm of hydrogen gas into said third epitaxial growth ambient;
      flowing between 50 sccm and 150 sccm of dichlorosilane gas into said third epitaxial growth ambient;
      flowing up to 200 sccm of a gas mixture of between 5 and 10 percent germane gas and a carrier gas into said third epitaxial growth ambient;
      flowing between 50 sccm and 100 sccm hydrogen chloride gas into said third epitaxial growth ambient; and flowing between 50 sccm and 200 sccm of a gas mixture of between 0.5 percent and 1 percent of diborane and a carrier gas into said third epitaxial growth ambient.

5. The process of claim 1, in which said step of forming said third PSD layer is performed so that said germanium content of said third PSD layer is between 20 atomic percent and 30 atomic percent.

6. The process of claim 1, in which said step of forming said first PSD layer is performed so that said thickness of said first PSD layer on said sidewalls of said PSD recesses is less than 30 nanometers.

7. The process of claim 1, in which said step of forming said third PSD layer is performed so that said thickness of said third PSD layer is between 15 and 40 nanometers.

* * * * *